United States Patent [19]

Eggert et al.

[11] 4,213,532

[45] Jul. 22, 1980

[54] ELECTRICAL HOUSING WITH STACKING BUMPERS

[75] Inventors: Hans-Joachim Eggert, Karlsfeld; Heinrich Zenkert; Rudi Kuehne, both of Munich; Otto Oberberger, Gilching, all of Fed. Rep. of Germany

[73] Assignee: Siemens Aktiengesellschaft, Berlin & Munich, Fed. Rep. of Germany

[21] Appl. No.: 708,899

[22] Filed: Jul. 26, 1976

[30] Foreign Application Priority Data

Aug. 28, 1975 [DE] Fed. Rep. of Germany ....... 2538340

[51] Int. Cl.² ...................... B65D 21/02; B65D 25/26
[52] U.S. Cl. .................................. 206/504; 206/512; 206/585; 220/85 K
[58] Field of Search .................. 220/23.6, 85 R, 85 K; 206/585, 586, 509, 510, 511, 512; 190/37; 217/53

[56] References Cited

U.S. PATENT DOCUMENTS

| 1,068,189 | 7/1913 | Waldschmitt | 190/37 |
| 2,496,182 | 1/1950 | Sykes | 190/37 |
| 3,356,209 | 12/1967 | Pezely | 206/586 |
| 3,565,243 | 2/1971 | Freeman | 217/53 |
| 3,836,043 | 9/1974 | Levin | 220/85 K |

*Primary Examiner*—George E. Lowrance
*Attorney, Agent, or Firm*—Hill, Van Santen, Steadman, Chiara & Simpson

[57] ABSTRACT

A rectangular housing, containing for instance, electronic communication and measuring devices, is protected from shocks and is made stackable together with like housings by a dumbbell-shaped rubber member at each vertical edge thereof, thickened in each end to protect respective corners of the housing. Each rubber member has metal inserts for bearing upon the housing corners and is screwed or bolted and pinned to the housing. Opposite top and bottom ends of the bumper have cooperable keys and sockets arranged for positive stacking of the bumpers of different housings one atop another. Bumpers of increasing hardness are provided for housings of increasing weight. Tabs are also provided on the housings for direct inter-attachment thereof independently of the rubber members.

10 Claims, 4 Drawing Figures

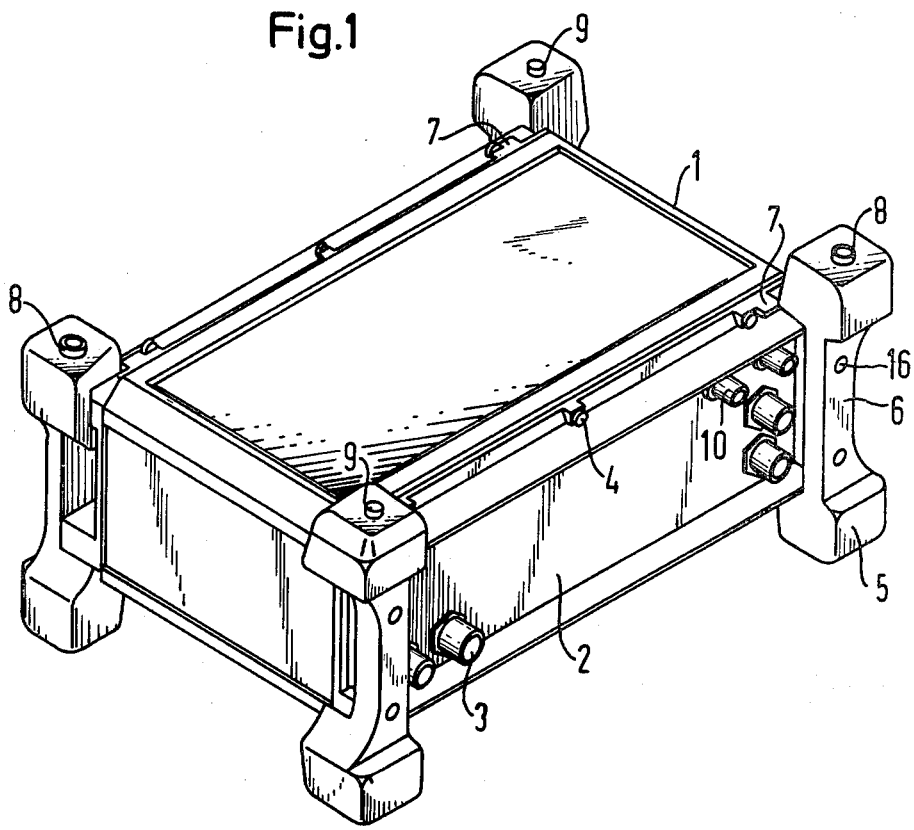

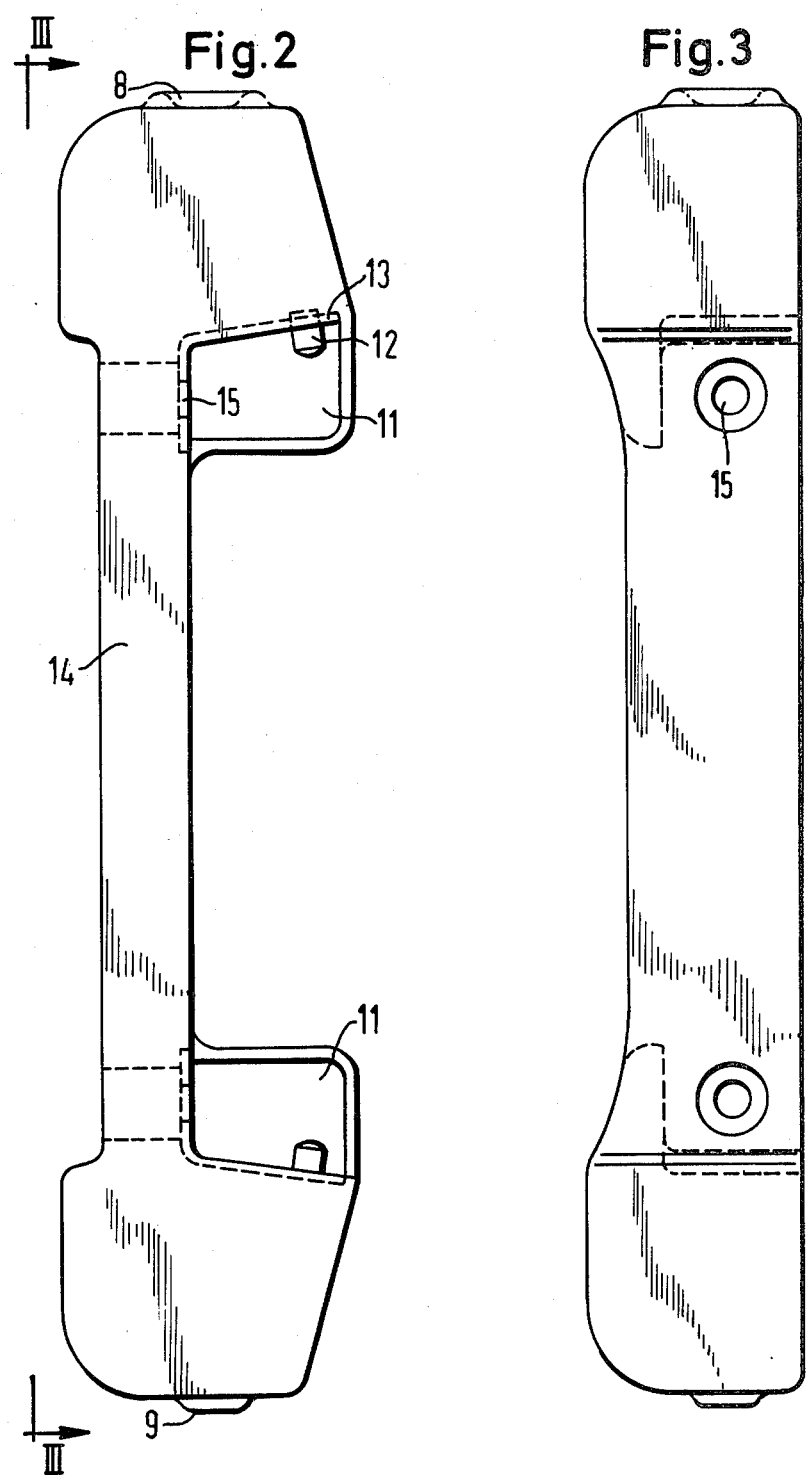

ELECTRICAL HOUSING WITH STACKING BUMPERS

BACKGROUND OF THE INVENTION

1. Field of the Invention

The present invention relates to housings for electrical components which have fixtures at upper and lower sides thereof permitting stacking and shock protection.

2. The Prior Art

Arrangements are known in the art in which housings are suspended in a frame so that relative motion is permitted between the frame and the housings. The spring suspension elements are, as, for instance, in the German Offenlegungsschrift 1,665,772, arranged diagonally with respect to the frame corners. In addition, it is known to provide impact-damping corner pieces attached to the corners of the outer frame, the corner pieces having metal caps with recesses and protrusions for stacking several frames. Such constructions are heavy, expensive, and inconvenient. There remains a need in the art for devices permitting impact protection and stacking of electrical housings.

SUMMARY OF THE INVENTION

A protective bumper element is attachable to a vertical edge of a rectangular housing of an electric device both to protect the housing from shocks and to facilitate stacking of housings provided with similar bumper elements. Each of the bumper elements comprises a flexible, central, elongated handle portion, and a thickened portion on either end of the handle portion. A pair of metal inserts are provided in the thickened portions, longitudinally aligned with one another and each being adapted to engage a respective corner of the housing. The bumper element is affixed to the housing with the thickened portions extending beyond the sides of the housing at each respective corner. Each bumper element has a key in one end and a socket in the opposite end, the key and socket being aligned longitudinally (vertically) to permit stacking of a plurality of the housings. The bumpers are attached to the housing by a pair of pins on the metal inserts which engage borings in the housing adjacent each corner thereof. The inserts are then also screwed to the housing by bolts extending therethrough transversely to the pins. The housings also are provided with rigid tabs on top and bottom covers thereof for engaging a rigid frame within which the elements are stackable. The bumpers are provided in materials of different rigidity, for use with housings of different weights.

BRIEF DESCRIPTION OF THE DRAWINGS

FIG. 1 is a general perspective view of a device of the present invention.

FIG. 2 is a side elevation view of a rubber bumper of the present invention.

FIG. 3 is a rear elevation view, taken on line III—III of FIG. 2.

DESCRIPTION OF THE PREFERRED EMBODIMENTS

Figure 4:
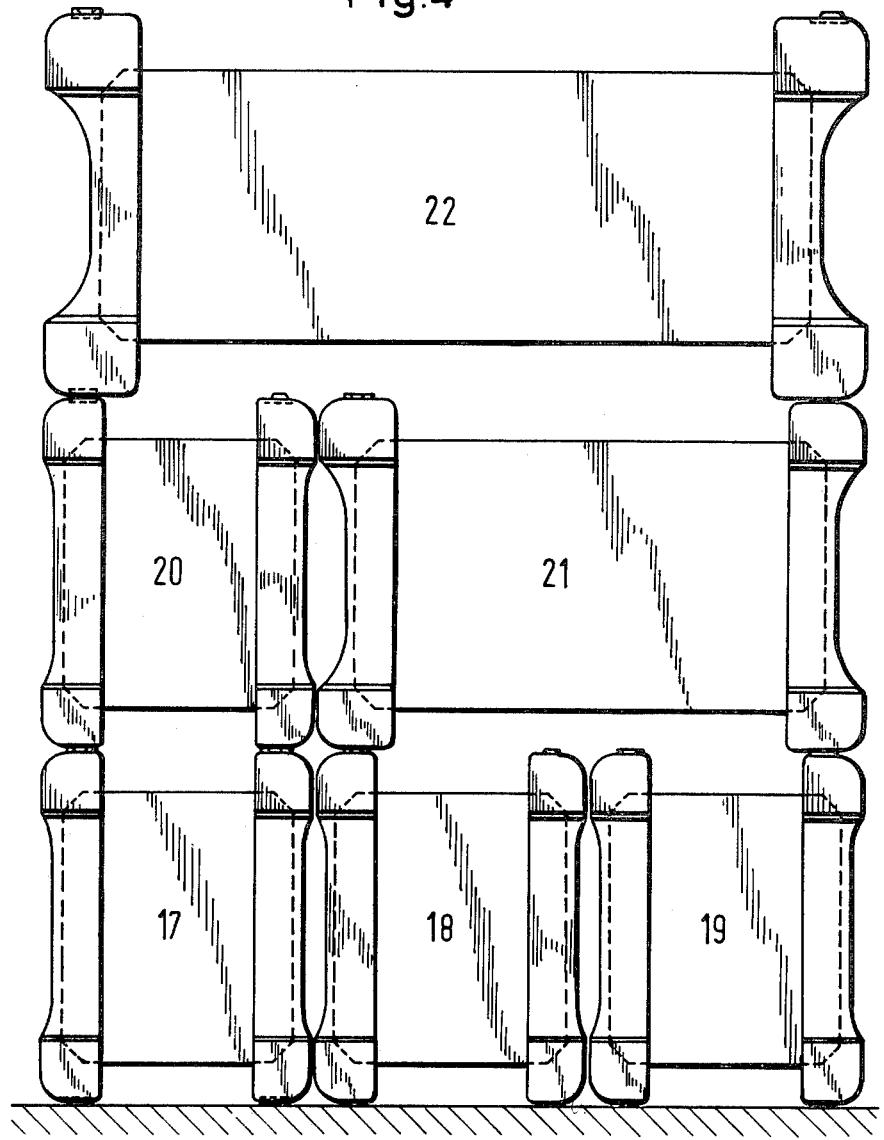
FIG. 4 is a partially schematic side elevation view of a stacked series of housings according to the present invention.

FIG. 1 shows a housing 1 for containing and protecting electrical devices as for communications or measurement purposes. The housing 1 is rectangular in shape and is generally comprised of metal sheets for electrical shielding and to maintain security from adverse environments. Connections such as plugs 3 and conduits 10 are sealed to a front plate 2 of the housing 1. The housing 1 comprises the front plate 2 and side and rear plates as well as top and bottom cover plates, as shown. The side and top plates are connected together by screws 4.

In accordance with the invention, dumbbell-shaped bumpers 6 are made of rubber and are arranged at the four vertical edges of the housing. The dumbbell shape has an elongate center portion thereof sufficiently spaced from the side plates of the housing to permit grasping by hand for carrying of the housing 1. Each bumper 6 has thickened ends 5 which extend beyond all three walls of the housing 1 at each corner, so that the housing is protected against shock in falling upon any plane surface. For optimum impact absorption, the bumpers are made of rubber, and harder-rubber bumpers are employed with heavier housings. The basic shape of the bumper, however, is maintained with any variations in materials.

Further in accordance with the principles of the invention, recesses 8 and keys 9 are provided at opposite upper and lower ends of each bumper. To avoid differences among bumpers on different corners, each bumper has one recess 8 and one key 9 on opposite ends. Mounting the bumpers upon the housing 1 for bumpers on any one side to be oriented identically for use as handles, one bumper will be inverted with respect to the other. To facilitate stacking of the housings by means of bumpers, in accordance with the invention, each key and socket on each bumper are vertically aligned and all sockets and keys on all bumpers are formed a fixed distance from the corner of the respective housings.

A metal insert 11 is provided for supporting and attaching the bumpers to the corners of the housing 1. As shown in FIGS. 2 and 3, each metal insert 11 consists of three sheets arranged approximately perpendicular to one another to form a corner. The metal is vulcanized into the rubber of the bumper. Where the upper and lower edges of the housing 1 are bevelled, the oppositely-facing parts of the metal insert 11 are arranged at an inclination to the vertical. Pins 12 are provided on the oppositely-facing portions of the insert 11 on side sheets 13. The pins extend normally from each side sheet. The housing 1 is bored to accept the pins 12, which are placed into the bores by flexing the center portion 14 of the bumper. A screw hole 15 formed in each end of the bumper 6 through a wall of the metal insert 11 transversely to the pins 12 is used to secure each bumper to the housing. Enlarged holes 16 through the rubber permit access to the screw heads.

The sockets 8 and keys 9 are preferably metal in construction, vulcanized into the rubber and having portions extending into the bumper somewhat for security.

FIG. 3 demonstrates schematically the stacking of several housings of different sizes or multiples of a unit length of the sides thereof. Thus, three smaller housings 17, 18, and 19 are placed next to one another on a plane surface or other support. A housing 20 is arranged above the housing 17 with the sockets on the bumpers of one receiving keys from the portions of the other. A larger housing 21 is received across the housings 18, 19 and upon opposite ends thereof. A triple-width housing 22 is placed with one edge resting upon the outer bumpers of the housing 20 and the other resting upon the bumpers of the housing 21. Since the larger housings must have more rubber mass in the bumpers, the recesses 8 and keys 9 are repositioned slightly with respect to the inner extent of the bumpers to maintain vertical alignment of the stacking elements among various sizes of bumpers. Thus, the entire housing block is stacked together with bumpers on all the outer corners thereof.

As shown in FIG. 1, projecting tabs 7 are provided on the housing 1 to make possible arrangement of devices more flexible. These tabs 7 may be rigidly interconnected with corresponding tabs of other housings in a frame structure. In suitable cases, the rubber bumpers between the housings will be unloaded by the tab connections, although the bumpers will be kept installed on the individual housings 1 to preserve shock protection for individual units upon removal from the combination. Then the frame as a whole may be mounted upon rubber bumpers.

Although various minor modifications may be suggested by those versed in the art, it should be understood that we wish to embody within the scope of the patent warranted hereon all such modifications as reasonably and properly come within the scope of our contribution to the art.

We claim as our invention:

1. A protective bumper element attachable to a housing of an electric device, the housing having vertical side walls and vertical and horizontal edges formed in a rectangle, and said element being attachable to the housing adjacent one of said vertical edges to protect the housing from shocks and to facilitate stacking of housings provided with similar bumper elements on four corners thereof, each said bumper element comprising:
   a flexible, central, elongated handle portion spaced from an adjacent one of said vertical edges and from adjacent vertical walls sufficiently for grasping said handle portion by hand thereabout;
   a thickened portion on either end of said handle portion;
   a pair of metal inserts integrally affixed to said bumper in said thickened portions thereof, said inserts being longitudinally aligned with one another and having surface means engaging respective corners of said housing; and
   means for affixing said bumper element securely to said housing whereby each said thickened portion extends beyond three sides of said housing at each respective corner.

2. A protective bumper element as defined in claim 1, wherein each said bumper element has a key extending from a first thickened end portion thereof and a socket arranged in an opposite thickened end portion thereof, the key and socket being aligned longitudinally with one another and with corresponding portions of other, identical bumper elements, whereby a plurality of housings may be stacked one atop another, a key on one element projecting into a socket on an adjoining element.

3. A protective bumper element as defined in claim 1, wherein each of said means for securely affixing said bumper element to said housing comprises:
   a pair of pins, one on each of said metal inserts, and corresponding first borings in the housing adjacent each corner thereof for receiving said pins; and
   a screw received transversely to said pins through a second boring in said bumper elements, said screw engaging said housing.

4. A protective bumper element as defined in claim 3, wherein said pins engage opposite top and bottom surfaces of said housing and are biased into said first borings by said handle portion of said bumper.

5. A rectangular housing for an electrical device having protective bumpers on corners thereof, the housing comprising:
   four vertical sides and top and bottom horizontal covers all joined together at edges and corners; and
   four dumbbell-shaped rubber bumpers affixed to said housing at four vertical edges thereof, each of said bumpers comprising:
   an elongate center portion having two ends,
   a pair of enlarged, thickened end portions integral with said ends of said center portion, extending about two of said corners of said sides and covers, and spacing said center portion from adjacent sides and an adjacent edge of the housing,
   a metal insert means imbedded in said bumper at each of said end portions to engage said corners of said sides and covers, and
   pin means and screw means for attaching said bumpers to said sides and covers of said housing.

6. A rectangular housing as defined in claim 5, wherein each of said bumpers carries a key and a socket on opposite end portions, said key and said socket being vertically aligned with one another and engageable with corresponding respective sockets and keys of other housings for vertical stacking of a plurality of said housings.

7. A rectangular housing as defined in claim 5, wherein said edges between said covers and said sides are bevelled and each of said metal insert means has an inclined sheet portion arranged to contact it least one of said bevelled edges.

8. A rectangular housing as defined in claim 7, wherein said pin means is located on said inclined sheet portion of said metal insert means and engages a corresponding boring in said bevelled edge.

9. A rectangular housing as defined in claim 5, wherein each of said covers has a plurality of projecting tab portions formed on edges thereof spaced from said corners, said tab portions being adapted to engage a rigid frame supporting a plurality of housings in a stack.

10. A housing and mounting system for electrical devices comprising:
   a plurality of rectangular housings having sides of any multiple of a unit length and a unit height;
   each of said housings having four dumbbell-shaped rubber bumper and handle units on vertical edges thereof and extending in spaced outward relationship to each edge and in engaging relationship to each corner of said housing,
   each of said bumper and handle units being constructed of a material having a rigidity proportional to the weight of its respective housing; and
   keys and sockets on opposite ends of said rubber bumper and handle units, each of said keys and sockets being in vertical alignment with one another on each bumper and handle unit and among said units, the keys and sockets facilitating stacking of the housings in vertical arrays.

* * * * *